United States Patent [19]

Mallos

[11] 4,346,376
[45] Aug. 24, 1982

[54] TOUCH POSITION SENSITIVE SURFACE

[75] Inventor: James B. Mallos, Freehold, N.J.

[73] Assignee: Bell Telephone Laboratories, Incorporated, Murray Hill, N.J.

[21] Appl. No.: 140,716

[22] Filed: Apr. 16, 1980

[51] Int. Cl.³ .............................................. G08B 5/36
[52] U.S. Cl. .................................... 340/712; 178/18; 250/549; 340/365 P
[58] Field of Search ........................ 340/365 P, 712; 250/549; 178/18

[56] References Cited

U.S. PATENT DOCUMENTS

| | | |
|---|---|---|
| 2,227,083 | 12/1940 | Handrick . |
| 3,271,515 | 9/1966 | Harper . |
| 3,526,775 | 9/1970 | Friedrich et al. . |
| 3,621,268 | 11/1971 | Friedrich et al. . |
| 3,673,327 | 6/1972 | Johnson et al. . |
| 3,707,715 | 12/1972 | Perotto ................................ 340/712 |
| 3,764,813 | 10/1973 | Clement et al. . |
| 3,775,560 | 11/1973 | Ebeling et al. . |
| 3,846,826 | 11/1974 | Mueller . |
| 4,177,354 | 12/1979 | Mathews . |
| 4,180,702 | 12/1979 | Sick et al. . |
| 4,198,623 | 4/1980 | Misek et al. . |

OTHER PUBLICATIONS

Brini, Pell, Rimondi, Veronesi; "On Large Scintillation Counters"; Supplemento AL Volume II, Series X, Del-Nuovo Cimento; Nov. 4, 1955; pp. 1062–1069.

Primary Examiner—David L. Trafton
Attorney, Agent, or Firm—David H. Tannenbaum

[57] ABSTRACT

A touch sensitive device is arranged with substantially parallel surfaces inside which light from a synchronized source, such as a CRT, can become trapped by total internal reflection. The edges of the device are fitted with photodetectors which respond to the entrapment of light within the surfaces. The top surface is arranged so that a touch of the device at a particular point will cause a medium change on the surface at that point. The medium change causes light to become entrapped within the surface by total internal reflection thus making it possible, by comparing the photodetector output with the CRT raster position, to determine the exact surface position of the touch. Using this arrangement, positional determination is uneffected by raster drift.

22 Claims, 6 Drawing Figures

TOUCH POSITION SENSITIVE SURFACE

TECHNICAL FIELD

This invention relates to a device for determining the position of a surface contact and more particularly to a touch sensitive device for use with a synchronized light source, such as a cathode ray tube (CRT).

BACKGROUND OF THE INVENTION

There are many applications where it is desired to provide feedback information for information displayed on a CRT screen. For example, it has become common practice with the use of computers to display on the screen a choice for the user to select from. The user is typically instructed to operate specific keys, on a keyboard or similar device, to select from among a menu of possible choices. In response to the user operating the selected key the menu is changed and the user is given a new choice, again making the choice by operating a particular key. Such an arrangement is tedious since a user must first look at the screen and then go to a separate keyboard to find the proper key. This is time consuming and requires costly separate equipment.

One possible solution to the problem has been to arrange the menu of choices along a side of the viewing screen and to arrange next to the screen a series of buttons. As the labels on the screen change the buttons become dynamically relabeled. While this solves some of the problems it does not allow the complete flexibility of the visual display and still requires an artificial arrangement of the display.

Several attempts have been made to solve the problem, one such being the use of a light pen which is held over the point on the CRT screen corresponding to the desired response. Light from the CRT raster then enters the pen and the position of the raster is determined by comparing the signal output from the pen to the position of the raster beam at the time of the signal. This arrangement, while performing properly, has the disadvantage of requiring the user to hold a pen and to properly direct the pen to the proper place on the screen.

Other touch sensitive screens used cross wires, crossed beams of infra red light, reflection of acoustic surface waves, current division in resistive sheets, force balancing, or mechanical buttons on which a display image was superimposed by a half silvered mirror. When used with a CRT display, the foregoing methods require careful calibration to establish correspondence between points on the touch screen and points on the display. The need for special transducers or many electrical connections increase complexity and cost.

Thus, it is desired to solve these problems in a manner which allows the visual display to be touched directly at any location on a dynamically changing basis with the position of the touch being easily determinable.

SUMMARY OF THE INVENTION

Advantage is taken of the fact that the CRT raster is a synchronized signal, the position of which is known at any point in time. I have overlaid the CRT screen with a device having parallel surfaces, such as a glass plate, through which light generated by the raster is visible to the user. The edges of the device are fitted with photodiodes which respond to the entrapment of light between the parallel surfaces to provide an output. By touching the top surface of the device (i.e., changing the medium bounding the surface) at a point the light from the CRT screen surface is caused to reenter the device and become entrapped therein by total internal reflection. This trapped light then travels to the sides of the device where the photodiodes detect the entrapment. By comparing the time of the changed photodiode output with the CRT raster position the exact surface position of the touch is determinable.

BRIEF DESCRIPTION OF THE DRAWING

These features and objects of my invention as well as others will be more fully appreciated from a review of the drawing in which.

DETAILED DESCRIPTION

Figure 1:
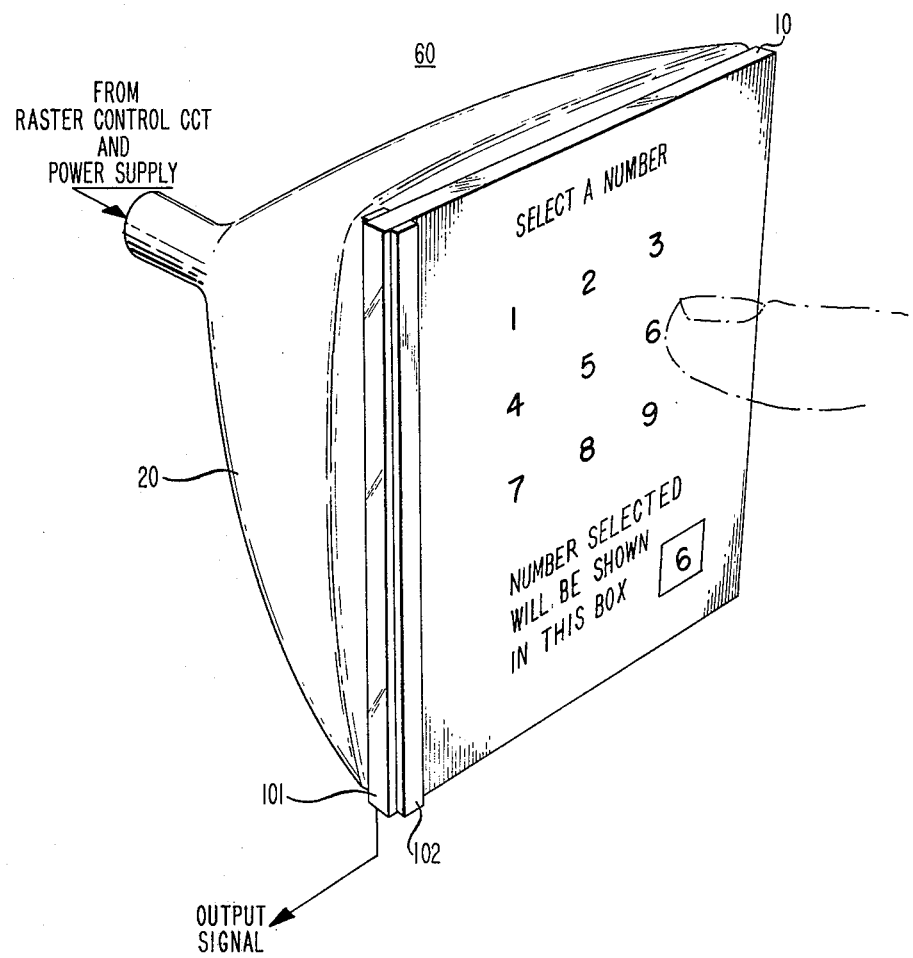
FIG. 1 shows a pictorial view of a CRT screen overlaid by my device.

As shown in FIG. 1, CRT 20 is arranged in the well known manner such that electrons from the electron gun (not shown) impinge upon the phosphorescent screen of the CRT in a sequential pattern, line by line, from top to bottom. As the electrons hit the phosphorescent surface the surface glows. Phosphorescent images can be formed on the screen under control of the electron beam. This phenomenon, of course, is now well known and forms the basis of television and other CRT systems.

By properly programming the system it is possible to have any type of image displayed at any position on the screen for any length of time. Thus, it is possible to create images representative of numbers, set of numbers, letters, or signals in any position on the screen. Using my device, it is possible to allow a user to touch any position on the device and to determine electronically the position of the touch. In order to accomplish this, I have overlaid the CRT screen with device 10 having parallel surfaces through which light from the phosphorescent screen may pass.

When the CRT screen projects an image calling for user response, a finger or other device is placed against screen 10 at the position selected (the number 6 in FIG. 1). When this occurs, as will be explained from that which will follow, light becomes trapped within device 10. This trapped light travels to the edge of the device and is detected by photodiodes 101 thereby providing an output signal useable for determining the position of the touch. The actual determination of the touch position is accomplished by comparing the position of the CRT raster to the time of the output signal. This comparison and determination is the subject of concurrently filed copending U.S. patent application of S. W. Bell, R. L. Breeden and M. J. Sabin, Ser. No. 140,714 which application is hereby incorporated by reference herein as though fully reproduced in this application.

Figure 2:
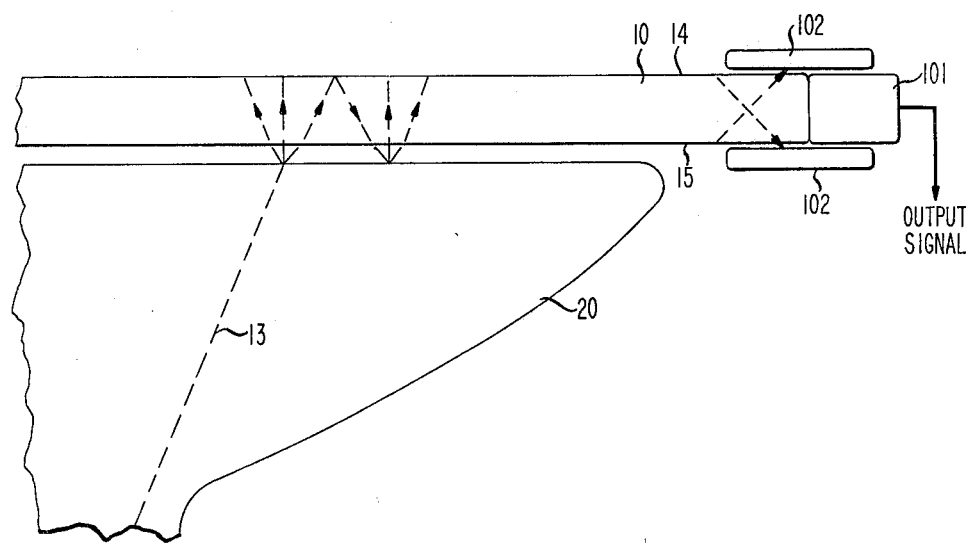
FIG. 2 is a schematic representation showing the device in the overlay, the overlay being in the untouched condition.

Turning to FIG. 2, CRT raster beam 13 is shown impinging on the front surface of CRT 20 with light rays 21 from the phosphorescent surface passing through the parallel surfaces 14 and 15 of device 10 and out into air. Most of the light rays are transmitted outward toward the user while some are reflected back toward the CRT screen. Because of the air gap between lower surface 15 and the front of the CRT the reflected light rays (as will be discussed) have an angle of refraction greater than the critical angle needed for total internal reflection and thus do not become trapped within device 10. These light rays, as they approach the edge of device 10, can never assume an angle sufficient to become trapped between surfaces 14 and 15 and thus as light approaches the edge of the device, it passes into a light absorbing surface such as surface 102 which may be black plastic. Very little additional light impinges upon photodiode 101 and thus the output signal reflects internally scattered light and has a value which, while constantly changing, is known for any instant in time.

Figure 3:
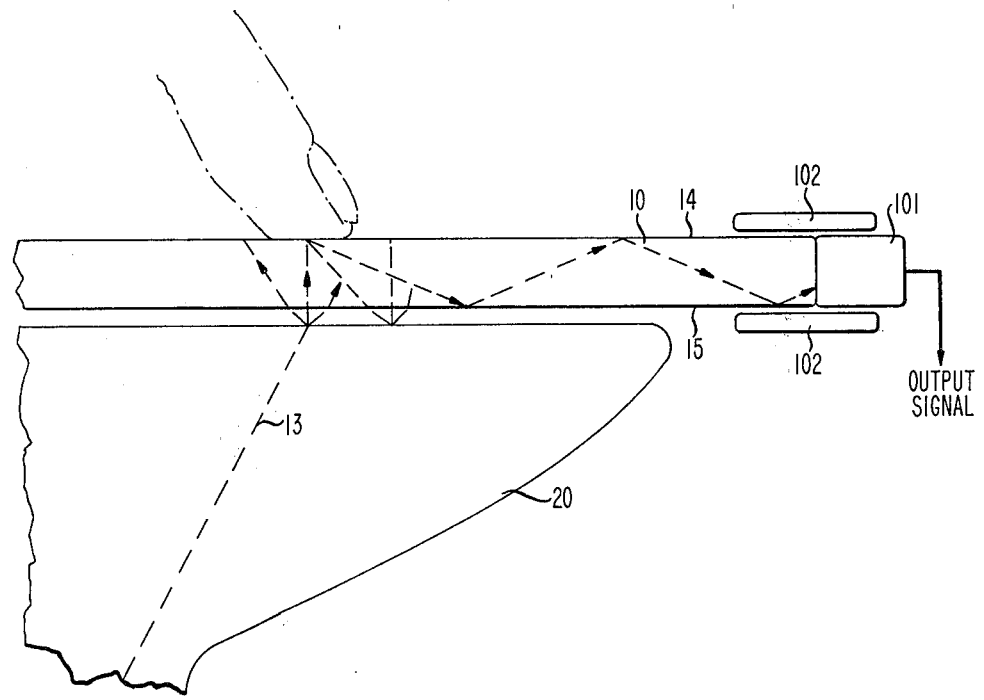
FIG. 3 shows my device with the finger in contact with the top parallel surface.

In FIG. 3, a finger is shown applying pressure at a point on top surface 14 of device 10. The gap is thus removed between the finger and top surface 14 of screen 10 at a point directly under the point of pressure contact. Reflectivity of the finger, as well as a change in the medium at the point of contact cause light to be reflected back into device 10. These reflected light rays, since they do not now pass through the air, do not refract as they did in FIG. 2 due to a refraction angle change (as will be discussed) and thus become trapped between surfaces 14 and 15 of screen 10 by total internal reflection.

This trapped light then travels, as shown, within device 10 and impinges upon photodiode 101. Note that light absorbers 102 are ineffective to absorb light since the light rays do not pass through surfaces 14 and 15. Thus, the light rays which impinge upon photodiode 101 cause an output signal which is different from the output signal generated when light does not impinge upon the photodiode.

It is important to note that photodiode 101 may be any type of device for converting optical or other signals to electrical energy and may be a single device or may comprise a number of individual devices, as shown in FIG. 10. In some applications a device at one surface would be sufficient while in other applications it would be advantageous to surround device 10 on all sides with such a transducer which, of course, may have a single output or multiple outputs. In some applications, the transducer may communicate with the edge of device 10 through a suitable light conduit, and thus may be physically located at any convenient location.

In order to even out the detector response the edges of the device, between the parallel surfaces can be coated white, or they may be polished and silvered.

Also, I have found that by using two-color sensitive detectors (such as red sensitive and blue sensitive) undesirable scattering effects can be reduced. To do this the outputs of two photodetectors having different spectral sensitivities may be mixed in such a way that the signals produced by light scattered from colorless objects (e.g., most greases and the surface imperfections of device 10) are nulled out. When this has been done most colored objects (e.g., the human finger) will still produce a substantial output signal.

In some instances it may be desirable to interpose miniature louvers or other directionally transparent material between the display screen 20 and device 10 in order to improve spatial resolution. This will especially be useful when the material bounding device 10 on the display side does not have an extremely low refractive index.

Though in this embodiment arrows have been shown on light rays to indicate a particular direction of propagation, light paths are always reversible, and thus a dual of the device described here can be constructed by replacing the photodetector with a photoemitter, and replacing the scanned display screen with a scanned photodetector array.

The touch position sensitive device described can also simultaneously sense touch-force provided that the touching stylus or membrane has known reflectivity and known force/deformation behavior.

If this device is used with a cathode ray tube very careful electrical shielding will be essential. In particular, interposing a ground plane between the CRT and the photodetectors is very helpful. Also, CRTs having phosphors with very fast initial decays will work best.

TOTAL INTERNAL REFLECTION CRITERIA

Figure 4:
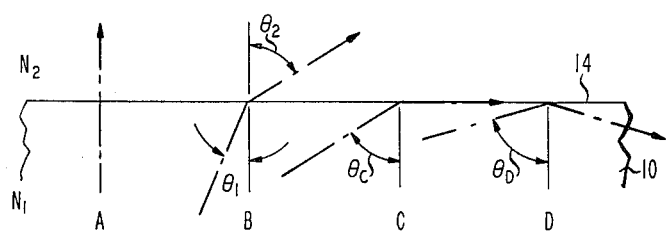
FIGS. 4 and 5 show the principles on which my invention is based.

Refraction at a single surface between media of refraction index $N_1$ and $N_2$ is shown in FIG. 4. Light ray A is perpendicular to the boundary and does not undergo refraction. Light ray B enters the boundary with an angle $\theta_1$ and is refracted according to Snell's law which states $$N_1 \sin \theta_1 = N_2 \sin \theta_2 \qquad (1)$$

Light ray C approaches the boundary with angle $\theta_C$ which is the critical angle for total internal reflection. This critical angle, when $N_2 = 1$, which is the case for air, is shown by the formula $$\sin \theta_C = N_2/N_1 = 1/N_1 \text{ when } N_2 = 1 \text{ (air)} \qquad (2)$$

Total internal reflection takes place when $\theta$ is larger than the critical angle such that $\theta_D$ is greater than $\theta_C$. Since sin of $\theta$ is less than 1 it follows that $N_2$ must be less than $N_1$ for total internal reflection to take place.

Figure 5:
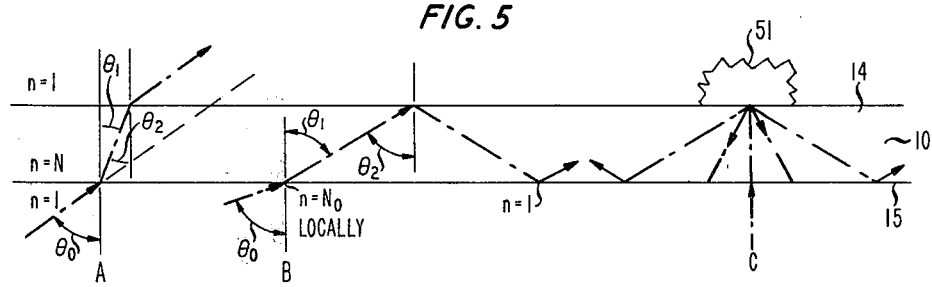

Turning now to FIG. 5, the conditions for total internal reflection (TIF) will be reviewed with respect to a device of refractive index N with air (refractive index = 1) at the surfaces of the device. When light ray A enters device 10 from air, total internal refraction cannot take place because the index of refraction at the lower surface bends the light ray to an angle smaller than the critical angle necessary for total internal refraction which is 1/N. This follows from use of geometry and Snell's law since $$\sin \theta_2 = \sin \theta_1 = \sin \theta_o / N, \qquad (3)$$

and $\sin \theta$ is less than 1 for all $\theta$.

In the case of light ray B (FIG. 5) the air space is eliminated when the light ray is assumed to enter from a medium with an index of refraction $N_o > 1$ which occurs when another body is in contact with the bottom surface of device 10. Total internal reflection can now take place (where air borders the device) because the light ray is no longer bent to an angle smaller than the critical angle at the lower surface. This follows from the fact that $$\sin \theta_2 = \sin \theta_1 = (N_o/N) \sin \theta_o \qquad (4)$$

which is greater than the critical angle 1/N when $$N_o \sin \theta_o > 1. \qquad (5)$$

Likewise, a diffusely reflecting body (N>1) in contact with the top surface of device 10 can scatter a light ray, shown as ray C in FIG. 5, in such directions that it becomes trapped by total internal reflections.

Figure 6:
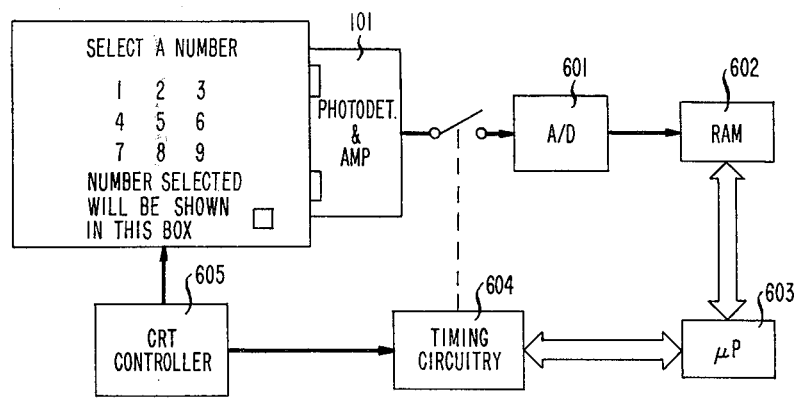
FIG. 6 shows a block diagram of an operational system.

FIG. 6 shows a typical system application as more fully detailed in the application of Bell-Breedan-Sabin.

CONCLUSION

It is understood that the signals may be optical, acoustical or may be electronic so long as they obey the physical phenomenon described. It, of course, is to be understood that those skilled in the art may find many applications and modifications using my invention and it may be built as a separate device for mating with an existing CRT or it may be manufactured as a part of the CRT implosion shield or tube face plate itself.

I claim:

1. A touch sensitive device for use in conjunction with a signal source, said device comprising
    spaced apart surfaces arranged such that signals are introduced between said surfaces so as to become entrapped within said device by total internal reflection between said surfaces as a result of a touch of one of said surfaces, and
    signal utilization means communicating with a region between said surfaces so as to provide a distinctive output when said signals are so introduced between said surfaces.

2. The invention set forth in claim 1 wherein a portion of said signals pass through said surfaces.

3. The invention set forth in claim 2 wherein said surfaces are substantially parallel to each other.

4. The invention set forth in claim 1 further comprising
    means for coordinating the position of said signal across said surfaces of said device with said distinctive output to determine the exact position on said one surface of said touch.

5. The invention set forth in claim 1 wherein said signal source is a CRT and wherein said signals which are introduced into said device are light signals from said CRT.

6. The invention set forth in claim 2 wherein said light utilization means includes at least one light detecting diode.

7. The invention set forth in claim 2 wherein said light utilization means includes optic fibers.

8. A position sensitive total internally reflective device for use in conjunction with a source of light, said device comprising
    substantially parallel surfaces arranged such that light from said light source impinging upon one of said surfaces is subject to a changeable light ray angle within said surfaces due to a change in the medium bounding said one surface, and
    light utilization means arranged to provide a distinctive output only when said impinging light is subjected to said changed light ray angle so as to become entrapped within said device by total internal reflection between said surfaces of said device.

9. The invention set forth in claim 6 further comprising
    means for coordinating the position of said light across said surfaces of said device with said distinctive output to determine the exact position on said one surface of said touch.

10. The invention set forth in claim 8 wherein said utilization means includes at least one light detecting diode.

11. The invention set forth in claim 8 wherein said detecting diode is mounted adjacent an edge of said parallel surfaces and where said edge is coated white.

12. The invention set forth in claim 6 wherein said distinctive output is generated by means which include a two-color detector.

13. The invention set forth in claim 6 wherein said medium bounding said one surface is changed by mechanical contact with said one surface.

14. A touch position sensitive total internally reflective device adapted for mating with the screen of a CRT operable for generating light patterns on the surface thereof, said light patterns being coordinately positioned under control of repetitive vertical and horizontal inputs, said device comprising
    a rigid sheet of transparent material having inner and outer surfaces substantially parallel to each other through which light from said mated CRT screen passes, said inner surface shaped to mate with said CRT, said outer surface being open to air,
    at least one light utilization means operable for providing outputs indicative of the magnitude of the light impinging on said utilization means,
    means for positioning said utilization means so that light which impinges thereupon comes substantially from within said device between said parallel surfaces, and so that when the air bounding said outer surface of said device is removed at a point on said outer surface said utilization means output reflects such removal for a period of time corresponding to the time when said light is being generated at said position where said air is removed.

15. The invention set forth in claim 14 wherein said air removal occurs as a result of contact being made with said outer surface by contact means having at least some reflectivity.

16. A device for use in combination with the screen of a CRT, said CRT operable for generating light images on the screen thereof, said light images occurring as a result of a horizontal and vertical scan of an electron beam directed against said screen, said device including
    a sheet of material having inner and outer parallel surfaces through which light generated at said CRT screen will pass with a refraction angle $\theta_1$ at said inner surface next to said CRT screen and with a refraction angle $\theta_2$ at said outer surface,
    light utilization means arranged along at least one edge said device and operable for providing an output representative of the magnitude of light which impinges on said light utilization means, and
    means for positioning said light utilization means such that said impinging light comes substantially from between said surfaces of said device and such that when said refraction angle $\theta_2$ is changed to refraction angle $\theta_3$ said light utilization means output reflects said angle change, said refraction angle $\theta_3$ being such that total internal reflection occurs.

17. The invention set forth in claim 16 wherein said light utilization means includes at least one photodetecting means.

18. The invention set forth in claim 16 wherein said photodetecting means includes first and second photodiodes having different spectral sensitivities.

19. The invention set forth in claim 17 wherein at least one of said edges of said sheet is reflective.

20. A CRT having a touch position sensitive total internally reflective screen, said screen comprising
substantially parallel surfaces arranged such that signals are introduced between said surfaces as a result of a change in medium bounding an outer one of said surfaces,
signal communicating means at the edge of said screen arranged to provide a distinctive output when said signals are introduced between said surfaces by a touch of said outer-surface so as to become entrapped within said screen by total internal reflection of said surfaces of said screen.

21. The invention set forth in claim 20 further comprising
means for coordinating the ordinate position of said signal across said screen with said distinctive output to determine said position on said screen of said touch.

22. A CRT operable for generating light images on the screen thereof, said light images occuring as a result of a horizontal and vertical scan of an electron beam directed against said screen, said CRT including
a screen having inner and outer parallel surfaces through which light generated by said electron beam will pass with a refraction angle $\theta 1$ at said inner surface and with a refraction angle $\theta 2$ at said outer surface
light utilization means arranged along at least one edge of said CRT and operable for providing an output representative of the magnitude of light which impinges on said utilization means, and
means for positioning said utilization means such that said impinging light comes substantially from between said surfaces of said screen and such that when said refraction angle $\theta 2$ is changed to a refraction angle $\theta 3$ said utilization means output reflects said angle change, said refraction angle $\theta 3$ being below the critical angle for total internal reflection to occur.

* * * * *

REEXAMINATION CERTIFICATE (965th)
United States Patent [19]

Mallos

[11] B1 4,346,376

[45] Certificate Issued  Dec. 13, 1988

[54] TOUCH POSITION SENSITIVE SURFACE

[75] Inventor: James B. Mallos, Freehold, N.J.

[73] Assignee: Bell Telephone Laboratories, Incorporated, Murray Hill, N.J.

Reexamination Request:
No. 90/001,252, Jun. 1, 1987

Reexamination Certificate for:
Patent No.: 4,346,376
Issued: Aug. 24, 1982
Appl. No.: 140,716
Filed: Apr. 16, 1980

Disclaimer of claim
(s) 1-3, 5, 6, 8, 10, 11, 13, 16, and 17 filed: May 26, 1987 (1087 O.G. 29)

[51] Int. Cl.⁴ .................. G08B 5/36; G09G 1/14
[52] U.S. Cl. ........................ 340/712; 178/18; 250/549; 340/365 P
[58] Field of Search ............... 340/703, 706, 707, 708, 340/711, 712, 815.31; 178/18

[56] References Cited

U.S. PATENT DOCUMENTS

| | | |
|---|---|---|
| 2,227,083 | 12/1940 | Handrick . |
| 3,271,515 | 9/1966 | Harper . |
| 3,526,775 | 9/1970 | Friedrich et al. . |
| 3,621,268 | 11/1971 | Friedrich et al. . |
| 3,673,327 | 6/1972 | Johnson et al. . |
| 3,680,078 | 7/1972 | Baskin et al. ............ 340/815.31 |
| 3,707,715 | 12/1972 | Perotto .................. 340/712 |
| 3,758,717 | 9/1973 | Granzotti ................ 340/815.31 |
| 3,764,813 | 10/1973 | Clement et al. . |
| 3,775,560 | 11/1973 | Ebeling et al. . |
| 3,846,826 | 11/1974 | Mueller . |
| 3,891,890 | 6/1975 | Yasuda et al. ........... 340/707 |
| 3,898,636 | 8/1975 | Smith ................... 340/707 |
| 4,177,354 | 12/1979 | Mathews . |
| 4,180,702 | 12/1979 | Sick et al. . |
| 4,198,623 | 4/1980 | Misek et al. . |
| 4,254,333 | 3/1981 | Bergstrom .............. 250/221 |
| 4,290,061 | 9/1981 | Serrano ................. 340/712 |

OTHER PUBLICATIONS

"On Large Scintillation Counters"; Supplemento AL vol. II, Series X, Del-Nuovo Cimento; 11-4-55; pp. 1062-1069; Brini et al.

Primary Examiner—Gerald L. Brigance

[57] ABSTRACT

A touch sensitive device is arranged with substantially parallel surfaces inside which light from a synchronized source, such as a CRT, can become trapped by total internal reflection. The edges of the device are fitted with photodetectors which respond to the entrapment of light within the surfaces. The top surface is arranged so that a touch of the device at a particular point will cause a medium change on the surface at that point. The medium change causes light to become entrapped within the surface by total internal reflection thus making it possible, by comparing the photodetector output with the CRT raster position, to determine the exact surface position of the touch. Using this arrangement, positional determination is uneffected by raster drift.

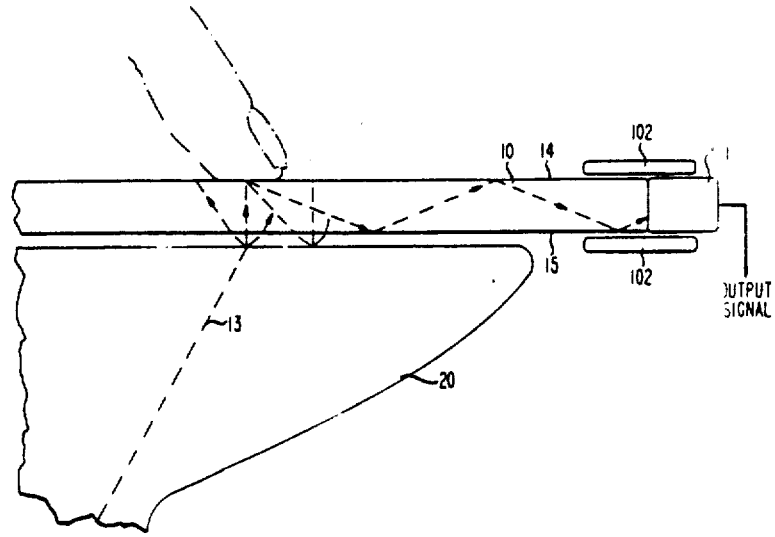

REEXAMINATION CERTIFICATE ISSUED UNDER 35 U.S.C. 307

THE PATENT IS HEREBY AMENDED AS INDICATED BELOW.

Matter enclosed in heavy brackets [ ] appeared in the patent, but has been deleted and is no longer a part of the patent; matter printed in italics indicates additions made to the patent.

AS A RESULT OF REEXAMINATION, IT HAS BEEN DETERMINED THAT:

Claims 1-3, 5, 6, 8, 10, 11, 13, 16 and 17 were previously disclaimed.

Claims 9, 14, 15 and 20-22 are cancelled.

Claims 4, 7, 12, 18 and 19 are determined to be patentable as amended.

New claims 23-28 are added and determined to be patentable.

4. The invention set forth in claim [1] *12 wherein said signal has a position on said surface at any instant and said invention* further [comprising] *comprises*
means for coordinating the position of said signal [across] *on* said surfaces of said device with said distinctive output to determine the exact position on said one surface of said touch.

7. The invention set forth in claim [2] *12* wherein said light utilization means includes optic fibers.

12. [The invention set forth in claim 6 wherein said distinctive output is generated by means which include] *A touch sensitive device for use in conjunction with a signal source, said device comprising*
*spaced apart surfaces arranged such that signals are introduced between said surfaces so as to become entrapped within said device by total internal reflection between said surfaces as a result of a touch of one of said surfaces, and*
*signal utilization means communicating with a region between said surfaces, said signal utilization means including a two-color detector which provides a distinctive output when said signals are so introduced between said surfaces.*

18. [The invention set forth in claim 16 wherein said photodetecting means includes] *A device for use in combination with the screen of a CRT, said CRT operable for generating light images on the screen thereof, said light images occurring as a result of a horizontal and vertical scan of an electron beam directed against said screen, said device including*
*a sheet of material having inner and outer parallel surfaces through which light generated at said CRT screen will pass with a refraction angle $\theta 1$ at said inner surface next to said CRT screen and with a refraction angle $\theta 2$ at said outer surface,*
*light utilization means including first and second photo-diodes having different spectral sensitivities arranged along at least one edge of said device and operable for providing an output representative of the magnitude of light which impinges on said light utilization means, and*
*means for positioning said light utilization means such that said impinging light comes substantially from between said surfaces of said device and such that when said refraction angle $\theta 2$ is changed to refraction angle $\theta 3$ said light utilization means output reflects said angle change, said refraction angle $\theta 3$ being such that total internal reflection occurs.*

19. The invention set forth in claim [17] *18* wherein at least one of said edges of said sheet is reflective.

23. *The invention set forth in claim 12 wherein a portion of said signals pass through said surfaces.*

24. *The invention set forth in claim 12 wherein said surfaces are substantially parallel to each other.*

25. *The invention set forth in claim 12 wherein said signal source is a CRT and wherein said signals which are introduced into said device are light signals from said CRT.*

26. *The invention set forth in claim 12 wherein said detecting diode is mounted adjacent an edge of said parallel surfaces and where said edge is coated white.*

27. *The invention set forth in claim 12 wherein said medium bounding said one surface is changed by mechanical contact with said one surface.*

28. *The invention set forth in claim 12 wherein said device is adapted for mating with a cathode ray tube screen.*

* * * * *